United States Patent
Shinkai et al.

(10) Patent No.: US 9,969,161 B2
(45) Date of Patent: May 15, 2018

(54) ELECTROMECHANICAL TRANSDUCER ELEMENT, LIQUID DISCHARGE HEAD, LIQUID DISCHARGE DEVICE, AND LIQUID DISCHARGE APPARATUS

(71) Applicants: Masaru Shinkai, Kanagawa (JP); Satoshi Mizukami, Kanagawa (JP); Toshiaki Masuda, Kanagawa (JP)

(72) Inventors: Masaru Shinkai, Kanagawa (JP); Satoshi Mizukami, Kanagawa (JP); Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days. days.

(21) Appl. No.: 15/447,266

(22) Filed: Mar. 2, 2017

(65) Prior Publication Data
US 2017/0253040 A1    Sep. 7, 2017

(30) Foreign Application Priority Data
Mar. 4, 2016    (JP) .................. 2016-041817

(51) Int. Cl.
*B41J 2/14*    (2006.01)
*H01L 41/18*    (2006.01)
(Continued)

(52) U.S. Cl.
CPC ....... *B41J 2/14233* (2013.01); *B41J 2/14201* (2013.01); *B41J 2/164* (2013.01);
(Continued)

(58) Field of Classification Search
CPC .. B41J 2/14233; B41J 2/14201; B41J 2/1607; B41J 2/164; H01L 41/18; H01L 41/1876;
(Continued)

(56) References Cited

U.S. PATENT DOCUMENTS

| | | |
|---|---|---|
| 2011/0090289 A1 | 4/2011 | Mizukami |
| 2012/0212545 A1 | 8/2012 | Mizukami et al. |

(Continued)

FOREIGN PATENT DOCUMENTS

| | | |
|---|---|---|
| JP | 2008-028030 | 2/2008 |
| JP | 2008-192868 | 8/2008 |

(Continued)

*Primary Examiner* — Geoffrey Mruk
(74) *Attorney, Agent, or Firm* — Cooper & Dunham LLP (57) ABSTRACT

An electromechanical transducer element includes a first electrode, a second electrode, and a piezoelectric material. The piezoelectric material is disposed between the first electrode and the second electrode and deformable with a voltage applied in accordance with a drive signal. The piezoelectric material is made of a composite oxide having a perovskite structure preferentially oriented in at least one of a (100) plane and a (001) plane. A drop in diffraction intensity is included in a rocking curve corresponding to at least one of a (200) plane and a (002) plane measured at a position of 2θ where the diffraction intensity is largest at a peak of diffraction intensity corresponding to the (200) plane out of peaks of diffraction intensity measured by an X-ray diffraction θ-2θ method.

10 Claims, 7 Drawing Sheets

(51) Int. Cl.
  *B41J 2/16* (2006.01)
  *H01L 41/187* (2006.01)
(52) U.S. Cl.
  CPC ............ *B41J 2/1607* (2013.01); *H01L 41/18* (2013.01); *H01L 41/1875* (2013.01); *H01L 41/1876* (2013.01); *C04B 2235/00* (2013.01); *C04B 2235/3232* (2013.01)
(58) Field of Classification Search
  CPC ............ H01L 41/1875; C04B 2235/00; C04B 2235/3232
  See application file for complete search history.

(56) References Cited

U.S. PATENT DOCUMENTS

| | | |
|---|---|---|
| 2012/0229573 A1 | 9/2012 | Mizukami et al. |
| 2012/0236083 A1 | 9/2012 | Mizukami et al. |
| 2013/0002767 A1 | 1/2013 | Mizukami et al. |
| 2013/0070029 A1 | 3/2013 | Mizukami et al. |
| 2013/0162726 A1 | 6/2013 | Mizukami et al. |
| 2014/0267509 A1 | 9/2014 | Shinkai et al. |
| 2015/0022592 A1* | 1/2015 | Aoyama ............... B41J 2/14233 347/68 |
| 2015/0077475 A1 | 3/2015 | Mizukami et al. |
| 2015/0171307 A1 | 6/2015 | Masuda et al. |
| 2015/0266296 A1 | 9/2015 | Mizukami et al. |
| 2016/0001556 A1 | 1/2016 | Masuda et al. |
| 2016/0099402 A1 | 4/2016 | Mizukami et al. |
| 2016/0167383 A1 | 6/2016 | Mizukami |

FOREIGN PATENT DOCUMENTS

| | | |
|---|---|---|
| JP | 2012-124233 | 6/2012 |
| JP | 2012-253161 | 12/2012 |
| JP | 2013-118232 | 6/2013 |
| JP | 2013-168530 | 8/2013 |
| JP | 2015-082541 | 4/2015 |
| JP | 2016-115755 | 6/2016 |

* cited by examiner

ELECTROMECHANICAL TRANSDUCER ELEMENT, LIQUID DISCHARGE HEAD, LIQUID DISCHARGE DEVICE, AND LIQUID DISCHARGE APPARATUS

CROSS-REFERENCE TO RELATED APPLICATION

This patent application is based on and claims priority pursuant to 35 U.S.C. § 119(a) to Japanese Patent Application Nos. 2016-041817 filed on Mar. 4, 2016 in the Japan Patent Office, the entire disclosure of which is hereby incorporated by reference herein.

BACKGROUND

Technical Field

Embodiments of the present disclosure relate to an electromechanical transducer element, a liquid discharge head, a liquid discharge device, and a liquid discharge apparatus.

Related Art

An image fondling apparatus, such as an inkjet recording apparatus, may include an electromechanical transducer element to displace a displacement plate constituting a wall surface of a liquid chamber to discharge liquid from the liquid chamber through a discharge orifice, in accordance with a drive signal.

For example, an electromechanical transducer element is proposed in which, for example, a lower electrode, an electromechanical conversion film having a structure of perovskite crystal such as lead zirconate titanate (PZT), and an upper electrode are laminated one on another.

SUMMARY

In an aspect of the present disclosure, there is provided an electromechanical transducer element that includes a first electrode, a second electrode, and a piezoelectric material. The piezoelectric material is disposed between the first electrode and the second electrode and deformable with a voltage applied in accordance with a drive signal. The piezoelectric material is made of a composite oxide having a perovskite structure preferentially oriented in at least one of a (100) plane and a (001) plane. A drop in diffraction intensity is included in a rocking curve corresponding to at least one of a (200) plane and a (002) plane measured at a position of 2θ where the diffraction intensity is largest at a peak of diffraction intensity corresponding to the (200) plane out of peaks of diffraction intensity measured by an X-ray diffraction θ-2θ method.

In another aspect of the present disclosure, there is provided a liquid discharge head that includes a discharge orifice, a liquid chamber, a displacement plate, and the electromechanical transducer element. The discharge orifice discharges liquid. The liquid chamber is communicated with the discharge orifice. The displacement plate constitutes at least one wall of the liquid chamber. The electromechanical transducer element displaces the displacement plate in accordance with the drive signal.

In another aspect of the present disclosure, there is provided a liquid discharge device that includes the liquid discharge head and at least one external component integrated with the liquid discharge head as a single unit.

In still another aspect of the present disclosure, there is provided a liquid discharge apparatus that includes the liquid discharge head to discharge the liquid from the discharge orifice in accordance with the drive signal.

In still yet another aspect of the present disclosure, there is provided a method of producing the electromechanical transducer element. The method includes directly or indirectly forming the piezoelectric material on the first electrode of the electromechanical transducer element.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity.

However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Below, an electromechanical transducer element according to an embodiment of the present disclosure is described that is incorporated in a liquid discharge head of an inkjet recording apparatus as a liquid discharge apparatus.

Inkjet recording apparatuses have many advantages, such as extremely noiseless operation, high-speed printing, a high degree of flexibility in ink, i.e., liquid for image formation, and availability of low-cost plain paper. Accordingly, inkjet recording apparatuses are widely used as image forming apparatuses, such as printers, facsimile machines, and copiers.

A liquid discharge head used in such an inkjet recording apparatus includes, for example, nozzles as discharge orifices to discharge liquid (ink) for image formation, pressurization chambers communicated with the nozzles, and pressure generators to generate pressure to discharge ink from the pressurization chambers. A pressure generator according to the present embodiment is a piezo-type pressure generator including a diaphragm plate and an electromechanical transducer element. The diaphragm plate is a displacement plate (deformable plate) constituting part of a wall of a pressurization chamber, and includes a piezoelectric material to deform the diaphragm. When a predetermined voltage is applied to the electromechanical transducer element, the electromechanical transducer element deforms to displace a surface of the diaphragm plate toward the pressurization chamber, thus generating pressure in liquid in the pressurization chamber. The pressure allows liquid droplets (ink droplets) to be discharged from a nozzle communicated with the pressurization chamber.

The piezoelectric material is a material having piezoelectric properties of being deformed by application of voltage. In the present embodiment, as the piezoelectric material, lead zirconate titanate (PZT: $Pb(Zr_x, Ti_{1-x})O_3$) is used that is a ternary metal oxide having a crystal structure of perovskite. For the electromechanical transducer element including the piezoelectric material made of PZT (hereinafter, PZT film), as described below, for example, pressurization chambers can be directly built-in a Si substrate by using technologies of semiconductor processing and micro electro mechanical systems (MEMS). Accordingly, the electromechanical transducer elements can be formed as thin-film piezoelectric actuators to generate pressure in the pressurization chambers.

Figure 1:
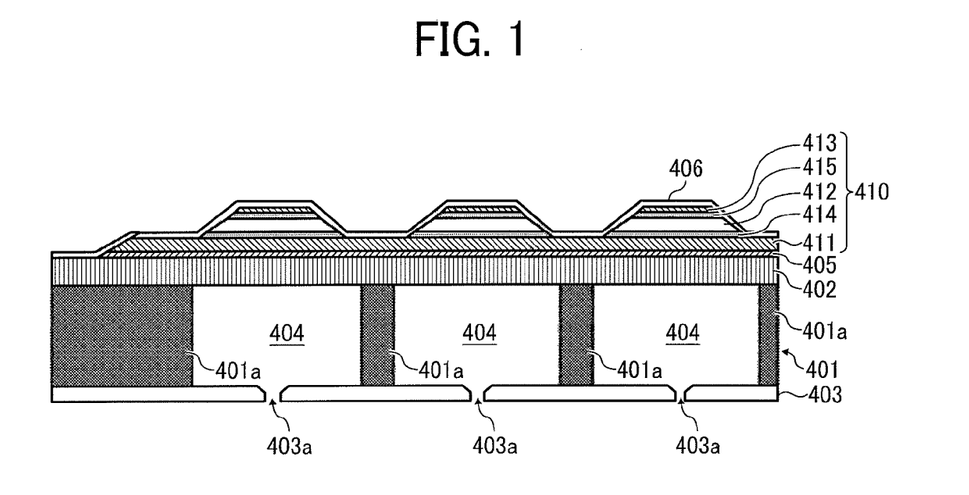
FIG. 1 is a cross-sectional view of an example of a configuration of a liquid discharge head according to an embodiment of the present disclosure.

Next, a description is given of an example of a structure of a liquid discharge head including an electromechanical transducer element 400 as the electromechanical transducer element according to the present embodiment. FIG. 1 is a cross-sectional view of an example of a configuration of a liquid discharge head according to the present embodiment. The liquid discharge head according to the present embodiment includes, for example, a substrate 401, a diaphragm plate 402, a nozzle plate 403, pressurization chambers (pressure chambers) 404, an adhesion layer 405, a lower electrode 411 as a first electrode, an orientation control layer 414, a PZT film 412 as the piezoelectric material, a conductive oxide layer 415, an upper electrode 413 as a second electrode, and a the protective layer 406. The adhesion layer 405, the lower electrode 411, and the orientation control layer 414 acts as base films that influence the crystallinity of the PZT film 412. The pressurization chamber 404 is formed so as to be surrounded with partitions 401a formed by the substrate 401, the diaphragm plate 402, and the nozzle plate 403. The pressurization chamber 404 is communicated with a nozzle 403a of the nozzle plate 403.

A silicon single crystal substrate is preferably used as the substrate 401 and the substrate 401 preferably has a thickness of from 100 μm to 600 μm. As plane orientations, three kinds of (100), (110), and (111) are known. However, (100) and (111) are generally used widely in the semiconductor industry. In the present embodiment, a monocrystalline substrate mainly having (100) plane orientation is used. For the present embodiment, in fabricating the pressurization chamber 404, the substrate 401 is processed by etching. As a method of etching, anisotropic etching is typically used. Anisotropic etching utilizes the property that the etching rate is different between plane orientations of crystal structure of the substrate 401. For example, in the anisotropic etching in which a substrate is immersed in an alkaline solution, such as KOH, the etching rate of a (111) plane is about 1/400 of the etching rate of a (100) plane. Accordingly, for the (100) plane orientation, a structure having an inclination of about 54.74° can be produced. For the (110) plane orientation, a deep groove can be formed, thus allowing an increase in array density while maintaining high rigidity. In the present embodiment, a monocrystalline substrate having (110) plane orientation can also be used as the substrate 401. In such a case, however, because $SiO_2$ to be a mask material might also be etched, the single crystal substrate having the surface of the (110) plane is used in consideration of the above point.

The diaphragm plate 402 is deformed and displaced under the force generated by the PZT film 412 to pressurize the pressurization chambers 404, to discharge the ink in the pressurization chambers 404 from the nozzles 403a. To implement such discharging action, the diaphragm plate 402 preferably has a predetermined strength. The diaphragm plate 402 may be made of a single material or a plurality of laminated films.

As a method of forming the diaphragm plate 402, a sputtering method, a combination of the sputtering method and a thermal oxidation method, a metal organic chemical vapor deposition (MOCVD) method, a low pressure chemical vapor deposition (LPCVD) method, or the like is used. The surface roughness of the diaphragm plate 402 is preferably 4 nm or less in arithmetic average roughness Ra. When the surface roughness exceeds this range, the dielectric strength voltage of the PZT film 412 to be formed later may deteriorate to cause leaks easily.

The material of the diaphragm plate 402 may be polysilicon, silicon oxide film, silicon nitride film, or a combination of these materials. The diaphragm plate 402 made of a film formed by the LPCVD method is generally used in semiconductor and MEMS devices and is easy to process. Accordingly, it is possible to obtain the stable diaphragm plate 402 without raising new process issues or using an expensive substrate such as silicon on insulator (SOI).

An example of a method of producing the liquid discharge head according to the present embodiment is described below. First, a silicon oxide film (200 nm thick, for example) is formed as a film constituting the diaphragm plate by the LPCVD method (or a thermal treatment film formation method), for example, on the substrate 401 that is made of a silicon single crystal substrate having a (100) plane orientation. Then, a polysilicon film (500 nm thick, for example) is formed. The thickness of the polysilicon film preferably falls within a range of from 0.1 μm to 3 μm. The surface roughness of the polysilicon film is preferably 5 nm or less in arithmetic average roughness Ra. Then, a silicon nitride film is formed as a film constituting the diaphragm plate by the LPCVD method, thereby forming the diaphragm plate 402 including the plurality of films.

Next, a lower electrode material film to be the lower electrode 411 is formed on the diaphragm plate 402 thus formed. In the case of using platinum as the material for the lower electrode 411, the adhesion layer 405 made of Ti, $TiO_2$, Ta, $Ta_2O_5$, and $Ta_3N_5$ is laminated earlier because adhesion between platinum and the diaphragm plate 402 is poor. As a method of producing the adhesion layer 405, vacuum film formation, such as a sputtering method or a vacuum vapor deposition method, is generally used. For the lower electrode 411 according to the present embodiment, platinum (Pt) with a high orientation (111) is used to form a platinum film with a peak intensity having been found to be high at the evaluation of platinum crystallinity by X-ray diffraction.

Next, the orientation control layer 414 is formed on the lower electrode 411. The material of the orientation control layer 414 is preferably, for example, titanium oxide or lead titanate. A titanium oxide film can form a PZT film that is rich in Ti by reacting to PZT of the sol-gel liquid laminated on the titanium oxide film. The Ti-rich film acts as a crystal source of the PZT film to be preferentially oriented in the (100) plane to form the (100) or (001) main orientation of the PZT film to be laminated on the Ti-rich film. When lead titanate is used as the orientation control layer 414, the orientation control layer 414 directly acts as a crystal source of the PZT film to be preferentially oriented in the (100) plane to form the (100) or (001) main orientation of the PZT film to be laminated on the orientation control layer 414.

The thickness of base layers for the PZT film 412 (the adhesion layer 405, the lower electrode 411, and the orientation control layer 414) is preferably not less than 0.02 μm and not greater than 0.5 μm, more preferably not less than 0.1 μm and not greater than 0.3 μm.

The PZT film 412 is a piezoelectric material that is made of a composite oxide having a perovskite structure containing at least lead, titanium, and zirconium, as described above. The PZT film 412 is a solid solution of lead zirconate ($PbTiO_3$) and lead titanate ($PbTiO_3$) that varies in properties depending on the ratio of the two substances. When the ratio of $PbZrO_3$ and $PbTiO_3$ is 53:47, the PZT film 406 has a generally excellent piezoelectric property. The composition is represented by a chemical formula of Pb $(Zr_{0.53}Ti_{0.47})O_3$, generally, PZT(53/47)

The piezoelectric material according to the present embodiment may be another composite oxide such as barium titanate as far as the composite oxide has a perovskite structure preferentially oriented in at least one of the (100) plane and the (001) plane. At this time, the composite oxide preferably contains at least lead, titanium, and zirconium. In the case of using barium titanate, barium alkoxide and a titanium alkoxide compound are used as starting materials and dissolved in a common solvent to prepare a barium titanate precursor solution. The barium titanate precursor solution is used to form a piezoelectric film made of barium titanate.

The material of the piezoelectric material made of a composite oxide having a perovskite structure is described by a general formula $ABO_3$ that is equivalent to a composite oxide containing A=Pb, Ba, and Sr, and B=Ti, Zr, Sn, Ni, Zn, Mg, and Nb as major ingredients. A specific description may be $(Pb_{1-x}, Ba_x)(Zr_{1-y}, Ti_y)O_3$ or $(Pb_{1-x}, Sr_x)(Zr_{1-y}, Ti_y)O_3$, for example, in which part of Pb in A site is substituted by Ba or Sr. The substitution is enabled in a bivalent element and an effect thereof is to decrease characteristic deterioration by the evaporation of the lead during the heat treatment.

As a producing method of the PZT film 412, the PZT film 412 can be produced by a spin coater using a sputtering method or a sol-gel method. In such a case, for patterning, a desired pattern is obtained by, for example, photolithoetching. When the PZT film 412 is prepared by a sol-gel method, lead acetate, zirconium alkoxide, and titanium alkoxide compounds are used as starting materials and are dissolved in methoxyethanol functioning as a common solvent and a uniform solution is obtained. Thus, a PZT precursor solution is prepared. Since metallic alkoxide compounds are susceptible to hydrolysis due to moisture in the atmosphere, an appropriate amount of acetylacetone, acetic acid, diethanolamine may be added as a stabilizer to the PZT precursor solution.

When the PZT film is formed on an entire surface of the base layer, the PZT film is obtained by forming a coating by a solution coating method, such as a spin coating method, and performing each heat treatment of solvent drying, thermal decomposition, and crystallization on the coating. Transformation from the coating to a crystalline film causes volume contraction. Therefore, the concentration of the PZT precursor solution is adjusted to obtain a film thickness of 100 [nm] or less by one step in order to obtain a crack-free film.

The film thickness of the PZT film 412 is preferably in a range of not less than 0.5 μm and not greater than 5 μm and is more preferably in a range of not less than 1 μm and not greater than 2 μm. If the film thickness is smaller than a film thickness in the range, sufficient strain deformation by piezoelectric effect cannot be generated and if the film thickness is larger than a film thickness in the range, the number of laminated films is excessive, thus increasing the number of steps and processing time.

In the present embodiment, the 2 μm-thick PZT film 412 was formed by spin coating using the PZT precursor solution prepared by the sol-gel method, and then the PZT film 412 was evaluated by an X-ray diffraction device. As a result, the PZT film 412 has been confirmed to be very preferentially oriented in the (100) plane. Note that the PZT film 412 preferably has degrees of orientation $\rho_{100}$ and $\rho_{001}$ of 85% or more on at least one of the (100) plane and the (001) plane obtained by Equation (1) described below and has a degree of orientation $\rho_{110}$ of 5% or less on the (110) plane. More preferably, the PZT film 412 has degrees of orientation $\rho_{100}$ and $\rho_{001}$ of 90% or more on at least one of the (100) plane and the (001) plane. When the degree of orientation is less than 85%, no sufficient properties in displacement deterioration after continuous driving can be obtained.

$$\rho = I(hkl)/\Sigma I(hkl) \qquad (1)$$

Equation (1) is intended to calculate the ratio of each of orientations on the (100) plane, (010) plane, (001) plane, (011) plane, (101) plane, (110) plane, and (111) plane obtained by X-ray diffraction with respect to the sum total of peak intensities in all the foregoing orientations as 1, and represents the average degree of orientation for each of the orientations. The denominator on the right side of Equation (1) refers to the sum total of the peak intensities in each of orientations, which is the peak intensity of the orientation to be calculated.

The at least one of the (100) plane and the (001) plane is described here because the 2θ values of the peak intensities measured by X-ray diffraction (XRD) on the (100) plane and the (001) plane are close to each other and observed as overlapping peaks, and thus are difficult to recognize separately. In addition, the PZT itself is characteristically considered as a pseudo tetragonal system, and the (100) plane and/or the (001) plane do not need to be separately recognized.

In the present embodiment, there is no particular limitation on the upper electrode 413. The material of the upper electrode 413 can be a material for use in a general semiconductor process such as Al or Cu, or a combination of these substances. In the present embodiment, SRO (SrRuO$_3$), excellent in adhesion to the PZT film 412 and having the same perovskite structure, was formed earlier as the conductive oxide layer 415, and then the upper electrode 413 made of platinum was formed on the conductive oxide layer 415. The upper electrode 413 is generally patterned by a photo-etching technique after the film formation, and the protective layer 406 is formed on the upper electrode 413. Then, a wiring film and an inter-layer insulation film are formed for power supply and signal supply, thereby producing an electromechanical transducer element.

Example 1

Next, an example of electromechanical transducer element according to the present embodiment (hereinafter, the present example will be referred to as "Example 1") is described. According to Example 1, a thermally oxidized film was formed on the surface of the substrate 401 made of a silicon single crystal substrate, and then a laminated diaphragm plate 402 was formed by CVD. Specifically, the thermally oxidized film (600 nm thick) was formed on a silicon wafer, and the laminated diaphragm plate 402 was produced on the thermally oxidized film by the LPCVD method. The laminated diaphragm plate 402 was obtained by forming a 200 nm-thick polysilicon film and then a 100 nm-thick silicon oxide film, and forming a 150 nm-thick silicon nitride film by the LPCVD method, and forming in sequence a 150 nm-thick silicon oxide film, a 150 nm-thick silicon nitride film, a 100 nm-thick silicon oxide film, and a 200 nm-thick polysilicon film, and finally forming a 600 nm-thick silicon oxide film.

Next, the base film for the PZT film 412 was formed. First, the adhesion layer 405 was formed on the diaphragm plate 402 described above. As a method for forming the adhesion layer 405, a Ti metal film was formed by a sputtering method and was oxidatively processed by a rapid thermal anneal (RTA) apparatus in an atmosphere of oxygen to form a TiO$_2$ film, thereby obtaining the adhesion layer 405. As an apparatus of forming the Ti metal film, a sputtering system SME-200 manufactured ULVAC, Inc. was used. To form the adhesion layer 405, the 50 nm-thick Ti metal film was formed at a substrate temperature of 150° C., with an input DC power of 300 W, and under an Ar gas pressure of 0.14 Pa, and the film was subjected to thermal oxidation firing for three minutes at a temperature of 730° C. (at a rate of temperature increase of 30° C./second), with an oxygen flow rate of 1 sccm, in an atmosphere of oxygen of 100%. Accordingly, the adhesion layer 405 with a film thickness of 83 to 86 nm was obtained.

Next, the 160 nm-thick lower electrode 411 was formed of platinum. The degree of vacuum in the process chamber and the transfer chamber was 1.0×10$^{-5}$ Pa before the film formation. The process conditions were a substrate temperature of 400° C., an input RF power of 500 W, and an Ar gas pressure of 0.16 Pa. Accordingly, the lower electrode 411 with the (111) plane oriented in the direction of film thickness was obtained. According to Example 1, the thickness of the platinum film was 160 nm because, at platinum film formation temperatures of 550° C. or more, white turbidity was observed on the films with thicknesses of more than 250 nm. The surface roughness of the lower electrode 411 after the film formation was 2.6 nm in the root-mean-square height Sq.

Next, the 5 nm-thickness orientation control layer 414 was formed on the lower electrode 411. The forming conditions were a substrate temperature of 150° C., an input DC power of 300 W, a pressure of Ar gas as a sputter gas of 0.14 Pa. At this time, the degree of vacuum in the process chamber and the transfer chamber was 1.0×10$^{-5}$ Pa before sputtering. The Ti metal film was formed by the sputtering method, and was oxidatively processed by a RTA apparatus in an atmosphere of oxygen to form a TiO$_2$ film, thereby obtaining the orientation control layer 414.

Next, the PZT film 412 was formed on the orientation control layer 414. As a material of the piezoelectric material according to Example 1, a raw material of most general PZT (with a composition satisfying Zr/Ti=52/48 after firing and a Pb excess amount of 15 atomic %) was selected. Alkoxide made of metal elements Pb, Zr, and Ti constituting PZT was used as a starting material. Note that methoxyethoxide was used as alkoxide. A sol-gel solution using this starting material was applied as a first layer to the orientation control layer 414 by spin coating, and was subjected to solidification firing. The condition for solidification firing was firing for five minutes at a temperature of 350 to 500° C. in an atmosphere of oxygen by the use of a hot plate and a RTA apparatus (first-stage firing). The purpose of the solidification firing was to release organic ingredients from the starting material.

Subsequently, the second layer and the third layer were applied and subjected to solidification firing in the same manner. Then, as firing for crystallization, the film was fired for three minutes at a temperature of 670 to 750° C. by a flow of a gas with a composition of N$_2$:O$_2$=4:3 (second-stage firing). The thickness of the film on which the three layers (M=3) were thus laminated was 250 nm. The process for laminating the three layers was repeated to form total eight layers (M=8), thereby forming the PZT film 412 with a total thickness of 2 µm.

After the production of the PZT film 412, the crystallinity of the PZT film 412 was measured by a X-ray diffraction apparatus and evaluated. As the X-ray diffraction apparatus, D8 DISCOVER produced by Broker Corporation was used.

There is a θ-2θ method as a frequently used method for measurement with X-ray diffraction. According to the θ-2θ method, an X ray is entered at an angle of θ into a substrate surface of a sample to be measured, and out of X rays reflected from the sample, the X ray at an angle of 2θ with respect to the direction of X-ray incidence is detected, and changes in the diffraction intensity with changes in θ are checked. At X-ray diffraction, the diffraction intensity is high when Bragg's condition (2d sin θ=nλ (λ: wavelength of X ray, d: clearance between crystal faces, n: integer)) is satisfied. At that time, there is a correlation between the clearance between crystal faces (lattice constant) and 2θ. Therefore, based on the values of 2θ with high diffraction intensities, the crystal structure of the sample into which the X ray is entered can be recognized.

Figure 2:
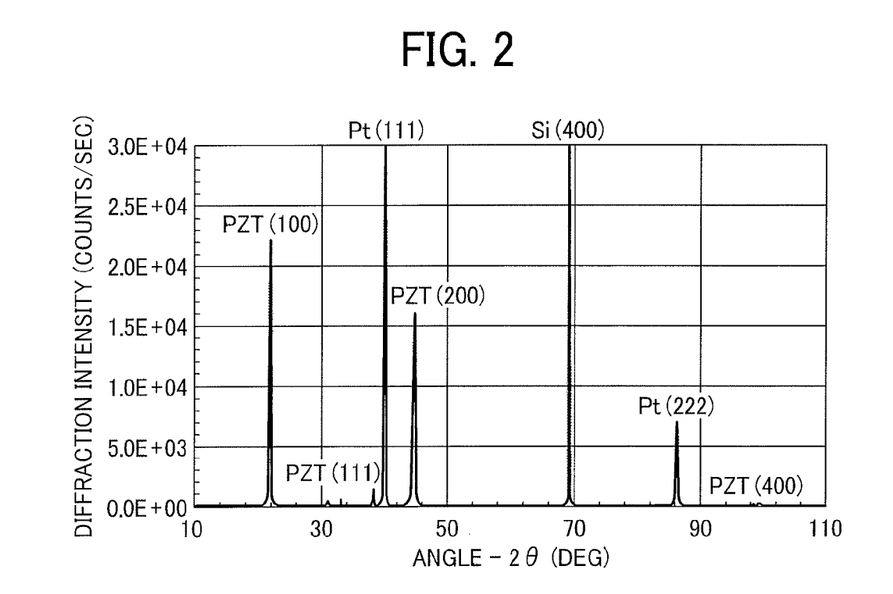
FIG. 2 is a graph of measurement results of 2θ values obtained by an X-ray diffraction θ-2θ method on a PZT film in Example 1.

FIG. 2 is a graph of measurement results of 2θ values obtained by the X-ray diffraction θ-2θ method on the PZT film 412 according to Example 1. The results of measurement by the θ-2θ method on the PZT film 412 according to Example 1 were that the peak intensity on the (100) plane was 150 kcps or more (150 to 200 kcps) and the orientation ratio on at least one of the (100) plane and the (001) plane was 90 to 99%.

Note that the θ-2θ method is used to determine how the clearance between crystal faces is distributed in the direction of film thickness at a certain point on the substrate surface of the film to be measured. Therefore, according to the θ-2θ method, it is not possible to determine how the clearance between crystal faces is distributed in the direction of film thickness at a point, slightly shifted from the certain point on the substrate surface in the plane direction of the substrate surface. As a method for determining the distribution, a rocking curve method is known. According to the rocking curve method, the incident angle of an X ray and the angle of a detector (2θ) are fixed at a position where the diffraction intensity measured by the θ-2θ method is largest, and the diffraction intensity is measured only with slight changes around θ in the angle (ω) formed by the substrate surface of the sample and the incident X ray.

Figure 3:
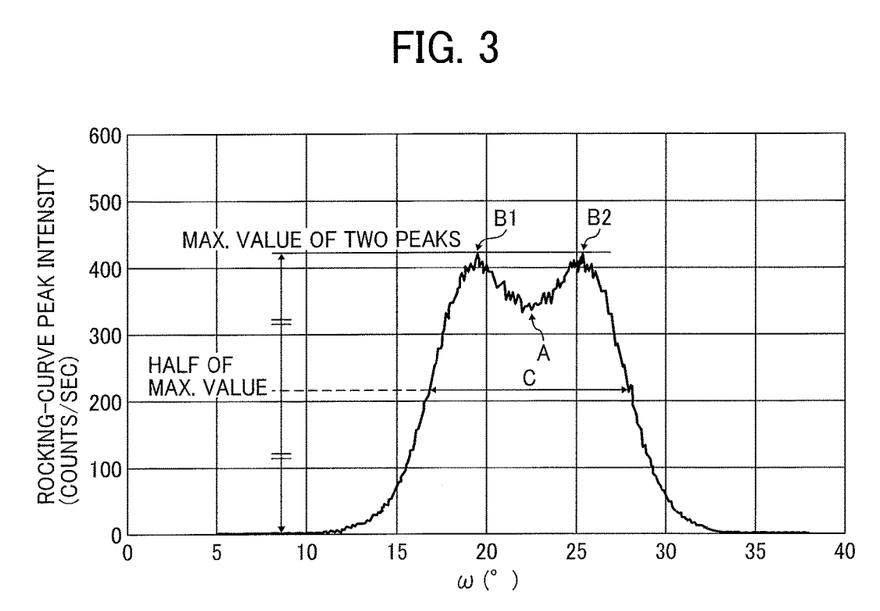
FIG. 3 is a graph of a rocking curve corresponding to at least one of a (200) plane and a (002) plane measured at a position (2θ) where the diffraction intensity is largest at a peak of diffraction intensity corresponding to the (200) plane out of the peaks of diffraction intensity measured by a X-ray diffraction θ-2θ method on the PZT film.

FIG. 3 is a graph of a rocking curve corresponding to at least one of a (200) plane and a (002) plane measured at a position (2θ) where the diffraction intensity is largest at a peak of diffraction intensity corresponding to the (200) plane out of the peaks of diffraction intensity measured by the X-ray diffraction θ-2θ method on the PZT film 412 according to Example 1. According to Example 1, the 2θ value is 46.229° at the peak position on the (200) plane of the PZT film 412 as illustrated in FIG. 2. The rocking curve illustrated in FIG. 3 is obtained by measuring the diffraction intensities only with slight changes in the angle (ω) formed by the substrate surface of the sample and the incident X ray at this peak position (46.229°). Hereinafter, the simple term "rocking curve" means the thus obtained rocking curve.

As illustrated in FIG. 3, the PZT film 412 according to Example 1 has one drop A in the diffraction intensity and two peaks B1 and B2 on the both sides of the drop A in the rocking curve. In addition, full width at half maximum (FWHM) C of the rocking curve, that is, the width between points corresponding to the half value of the largest peak intensity in the rocking curve was 11.3°.

Next, a 40 nm-thick SrRuO$_3$ film was formed as the conductive oxide layer 415 on the PZT film 412, and the upper electrode 413 was formed on the SrRuO$_3$ film. The conditions for producing the upper electrode 413 were to form a 100 to 150 nm-thick platinum film at a substrate temperature of 300° C. The process conditions were an input RF power of 500 W and an Ar gas pressure of 0.5 Pa. Then, a photosensitive resist pattern was formed by using a photolithographic technique, and then was etched by a chlorine-based etching gas to form the upper electrode 413.

Then, the lower electrode 411 was subjected to photolithographic patterning by a photosensitive resist for a wider pattern than the ferroelectric pattern and the upper electrode pattern, thereby to pattern the base film in the same manner as the patterning of the PZT film 412 and the patterning of the upper electrode 413.

After the formation of the electrode patterns, a 60 nm-thick Al$_2$O$_3$ film was formed as the protective layer 406 by an atomic layer deposition (ALD) method. Accordingly, the electromechanical transducer element was produced with the lower electrode 411, the PZT film 412, and the upper electrode 413 on the diaphragm plate 402. As a structure of the electromechanical transducer element, a wiring electrode pattern electrically coupled to the lower electrode 411 and the upper electrode 413 via contact holes, a lead pattern of a power line for element driving, and others were further formed.

Next, the substrate 401 was processed to form the pressurization chambers 404 on the side opposite to the thus produced electromechanical transducer element via the diaphragm plate 402. In this processing, first, the opposite side of the substrate 401 was patterned with a photosensitive resist, and was etched to form cavities to be the pressurization chambers 404. At this time, the SiO$_2$ film in the diaphragm plate 402 acts as an etching stop layer. Subsequently, a subframe (holding substrate) was joined to the processed substrate 401, then a mask layer was formed on the electromechanical transducer element side of the substrate 401 with a photosensitive resist in the same manner, and then the substrate 401 was processed by inductively coupled plasma (ICP). After the ICP processing, the mask layer formed with the photosensitive resist was removed. Then, the nozzle plate 403 made of SUS316 (50 μm thick) with nozzles 403*a* corresponding to the pressurization chambers 404 was joined by an epoxy resin to the side of the pressurization chambers 404 opposite to the electromechanical transducer element, thereby producing a liquid discharge head.

In the liquid discharge head according to Example 1, the pitch of the electromechanical transducer element is 85 μm, the width of the piezoelectric material of the electromechanical transducer element (the length of the PZT film 412 along the direction of nozzle arrangement: the horizontal length in FIG. 1) is 46 μm, the length of the piezoelectric material (the length of the PZT film 412 along the direction orthogonal to the direction of nozzle arrangement: the longitudinal length in FIG. 1) is 750 μm, and the thickness of the piezoelectric material (the thickness of the PZT film 412) is 2 μm. In addition, each of the pressurization chambers 404 has a width (the length of the pressurization chamber 404 along the direction of nozzle arrangement: the horizontal length in FIG. 1) of 60 μm, a length (the length of the pressurization chamber 404 along the direction orthogonal to the direction of nozzle arrangement: the longitudinal direction in FIG. 1) of 800 μm, and a depth of 55 μm.

Then, the electromechanical transducer element was subjected to a polarization treatment with an applied voltage of 40V (increasing slowly the voltage from 0V in three minutes, holding the increased voltage for one minute, and then decreasing slowly the voltage to 0V in three minutes) such that the lower electrode 411 side was at a negative potential or as an earth and the upper electrode 413 side was at a positive potential.

A triangular wave-shaped drive voltage of 0 to 30V (the upper electrode at a positive potential) was applied to the thus obtained electromechanical transducer element on an application cycle of 100 kHz, and the amount of displacement of the central portion of the element was measured by a laser interferometer (outputting the distance between two points). A measurement point was a center of an element portion. Assuming that the position of the center of the element portion at rest was zero, the amount of displacement was 0.230 μm.

Example 2

Next, another example of electromechanical transducer element according to the present embodiment (hereinafter, the present example will be referred to as "Example 2") is described. According to Example 2, a liquid discharge head was produced under the same producing conditions as the producing conditions according to Example 1 except that the platinum film formation temperature (substrate temperature) at the time of production of the lower electrode 411 was 500° C. With changes in the platinum film formation temperature (substrate temperature), the surface roughness of the lower electrode 411 as the base layer for the PZT film 412 (the surface roughness of the platinum film) or the particle size of the lower electrode 411 is changed. When the surface roughness or particle size of the lower electrode 411 changes, the crystal structure of the PZT film 412 formed on the lower electrode 411 also changes. The changes in the crystal structure lead to changes in the shape of the rocking curve (the presence or absence of a drop in diffraction intensity, the position of the drop, and the diffraction intensity of the drop, or the number of peaks, the positions of the peaks, and the diffraction intensities of the peaks, or the full width at half maximum of the rocking curve).

Figure 4:
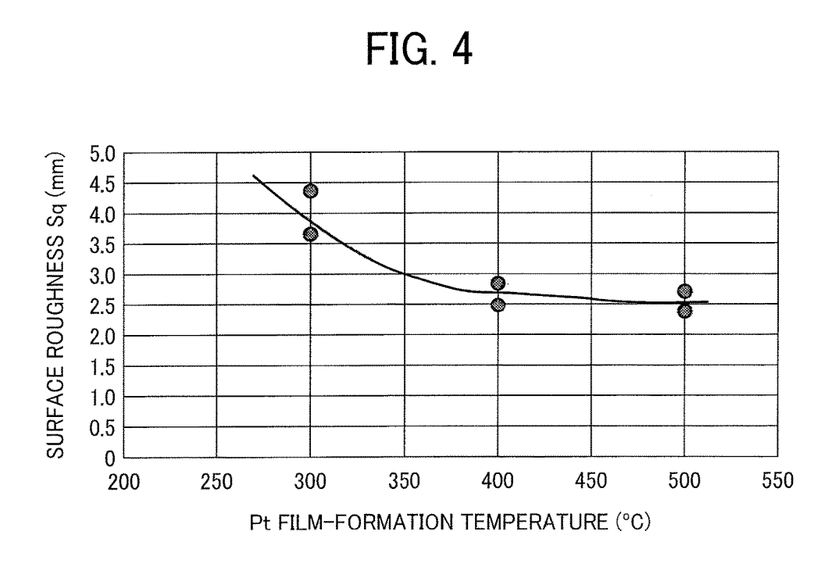
FIG. 4 is a graph illustrating a relationship between the film formation temperature (substrate temperature) of a platinum film at the time of production of a lower electrode and the particle diameter of the lower electrode.
Figure 5:
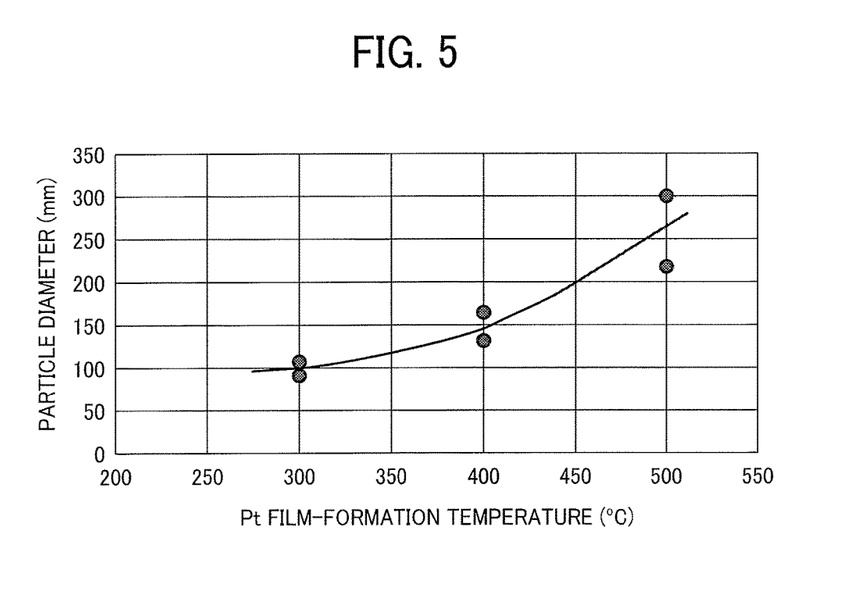
FIG. 5 is a graph illustrating a relationship between the film formation temperature (substrate temperature) of the platinum film at the time of production of the lower electrode and the surface roughness (root-mean-square height Sq) of the lower electrode.

FIG. 4 is a graph illustrating a relationship between the film formation temperature (substrate temperature) of a platinum film at the time of production of the lower electrode 411 and the particle diameter of the lower electrode 411. FIG. 5 is a graph illustrating a relationship between the film formation temperature (substrate temperature) of the platinum film at the time of production of the lower electrode 411 and the surface roughness (root-mean-square height Sq) of the lower electrode 411. As illustrated in FIG. 4, the particle size of the lower electrode 411 tends to increase as the film formation temperature of the platinum film in the lower electrode 411 is higher. Meanwhile, as illustrated in FIG. 5, when the film formation temperature of the platinum film in the lower electrode 411 falls within a range of lower than 400° C., the surface roughness (root-mean-square height Sq) of the lower electrode 411 tends to be smaller as the film formation temperature is higher, and when the film formation temperature of the platinum film in the lower electrode 411 falls within a range of 400° C. and more, the surface roughness (root-mean-square height Sq) of the lower electrode 411 does not change even with changes in the film formation temperature.

In Example 2, the surface roughness (root-mean-square height Sq) of the lower electrode 411 was 2.5 nm on average. The PZT film 412 was formed on the surface of the lower electrode 411, and the full width at half maximum of the rocking curve of the PZT film 412 was measured and found to be 12.4°. At this time, the rocking curve had one drop in diffraction intensity and two peaks positioned on the both sides of the drop as in Example 1. In addition, the amount of displacement of the electromechanical transducer element according to Example 2 was measured in the same manner as in Example 1 and was found to be 0.220 μm.

Comparative Example 1

Next, another example of electromechanical transducer element according to the present embodiment (hereinafter, the present example will be referred to as "Example 2") is described. According to Comparative Example 1, a liquid discharge head was produced under the same producing conditions as the producing conditions according to Example 1 except that the platinum film formation temperature (substrate temperature) at the time of production of the lower electrode 411 was 300° C.

In Comparative Example 1, the surface roughness (root-mean-square height Sq) of the lower electrode 411 was 4.0 nm (3.66 to 4.35 nm). The PZT film 412 was formed on the surface of the lower electrode 411, and the full width at half maximum of the rocking curve of the PZT film 412 was measured and found to be 9.4°. The crystal orientation seemed favorable in terms of the full width at half maximum. The rocking curve had no drop in diffraction intensity as in Example 1 and Example 2 but had a sharp shape with one peak.

From conventional thinking, the foregoing electromechanical transducer element had a relatively large amount of displacement. The amount of displacement was measured as in the same manner as in Example 1 and was found to be 0.180 μm that was smaller than the values in Example 1 and Example 2.

Table 1 below collectively shows the film formation temperatures (substrate temperatures) of the platinum films at the time of production of the lower electrode 411, the full widths at half maximums (FWHM) of the rocking curves, the surface roughnesses (Sq), and the amounts of displacement of the central portions of the electromechanical transducer elements according to Example 1, Example 2, and Comparative Example 1.

TABLE 1

| | Substrate temperature [° C.] | FWHM [°] | Surface roughness [nm] | Amount of displacement [μm] | Rocking curve shape |
|---|---|---|---|---|---|
| Example 1 | 400 | 11.3 | 2.6 | 0.23 | Two peaks with drop |
| Example 2 | 500 | 12.4 | 2.5 | 0.22 | Two peaks with drop |
| Comparative Example 1 | 300 | 9.4 | 4.0 | 0.18 | One peak without drop |

Figure 6:
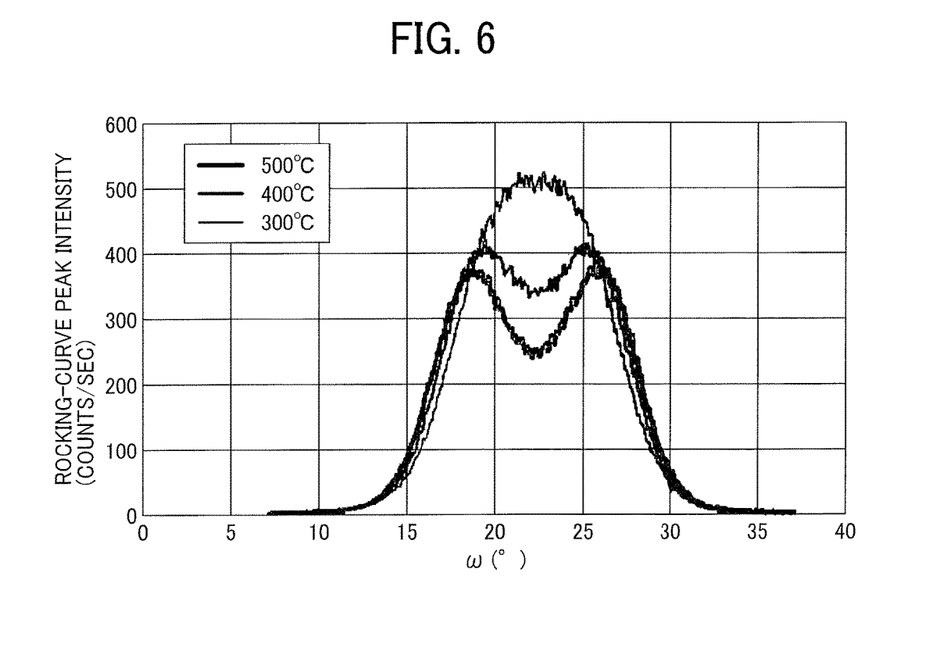
FIG. 6 is a graph of overlapping rocking curves of Comparative Example 1 in which the film formation temperature (substrate temperature) of the platinum film was 300°, Example 1 in which the film formation temperature (substrate temperature) of the platinum film was 400°, and Example 2 in which the film formation temperature (substrate temperature) of the platinum film was 500° at the time of production of the lower electrode.

FIG. 6 is a graph of overlapping rocking curves of Comparative Example 1 in which the film formation temperature (substrate temperature) of the platinum film was 300° C., Example 1 in which the film formation temperature (substrate temperature) of the platinum film was 400° C., and Example 2 in which the film formation temperature (substrate temperature) of the platinum film was 500° C. at the time of production of the lower electrode 411. The electromechanical transducer elements according to Example 1 and Example 2 have larger amounts of displacement than the amount of displacement in Comparative Example 1, and have a drop in the rocking curve that is not seen in Comparative Example 1. These drops are assumed to relate to the increased amounts of displacement.

Figure 7:
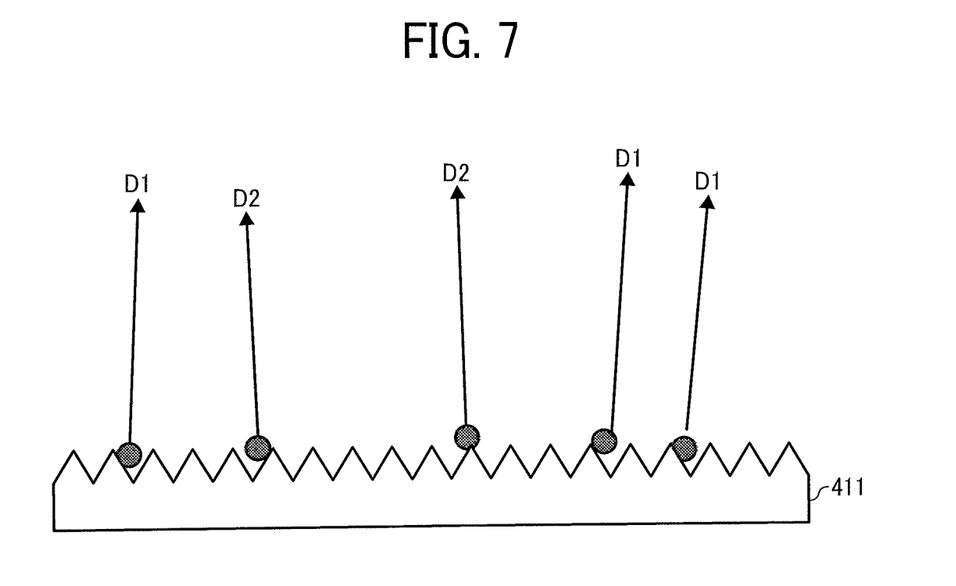
FIG. 7 is a schematic diagram illustrating the growth directions of crystal in Comparative Example 1.
Figure 8:
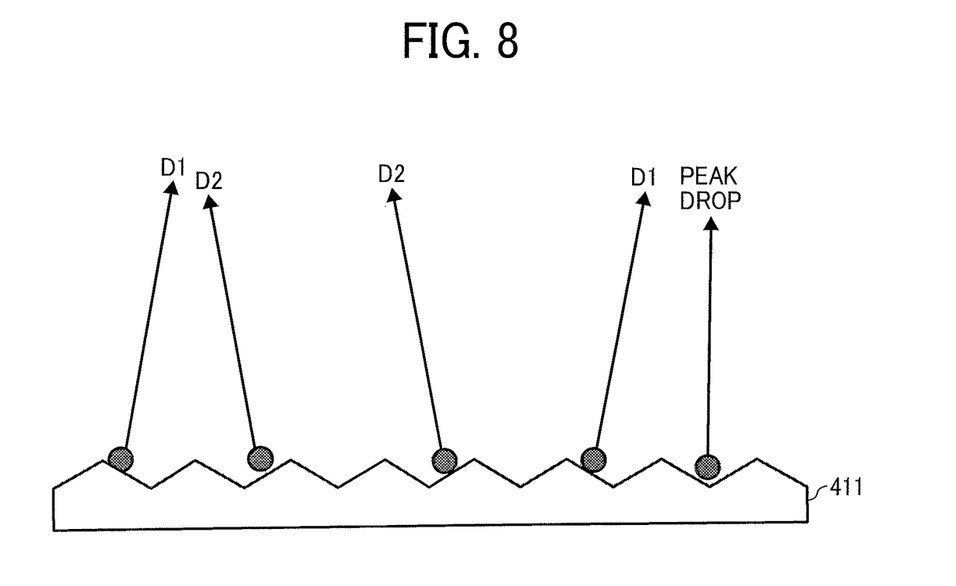
FIG. 8 is a schematic diagram illustrating the growth directions of crystal in Example 1 and Example 2.

FIG. 7 is a schematic diagram illustrating the growth directions of crystal in Comparative Example 1. FIG. 8 is a schematic diagram illustrating the growth directions of crystal in Example 1 and Example 2. The PZT film 412 is formed on the lower electrode 411 by growing crystal from a seed layer as a crystal nucleus on the lower electrode 411. At this time, the growth directions of crystal illustrated by arrows D1 and D2 in FIGS. 7 and 8 (the directions corresponding to the peaks in the rocking curves) are assumed to indicate different tendencies depending on differences in the surface roughness (Sq) of the lower electrode 411. In FIGS. 7 and 8, arrows 1 correspond to peaks in the rocking curves on the side where the angle (ω) formed by the substrate surface of the sample and the incident X ray is smaller, and arrows 2 correspond to peaks in the rocking curves on the side where the angle (ω) formed by the substrate surface of the sample and the incident X ray is higher.

Specifically, when the surface roughness (Sq) of the lower electrode 411 is large as in Comparative Example 1, the growth directions D1 and D2 of crystal of PZT on the surface of the lower electrode 411 are aligned in one direction as illustrated in FIG. 7. It is considered that this leads to the sharp shape of the rocking curve small in full width at half maximum with a single peak.

Meanwhile, when the surface roughness (Sq) of the lower electrode 411 is small as in Example 1 and Example 2, the growth directions D1 and D2 of crystal of PZT on the surface of the lower electrode 411 are hard to align in one direction as illustrated in FIG. 8. In Example 1 and Example 2, the growth directions D1 and D2 of crystal are aligned in two directions, and it is considered that this leads to the shapes of the rocking curves with two peaks and a drop between the peaks.

Figure 9:
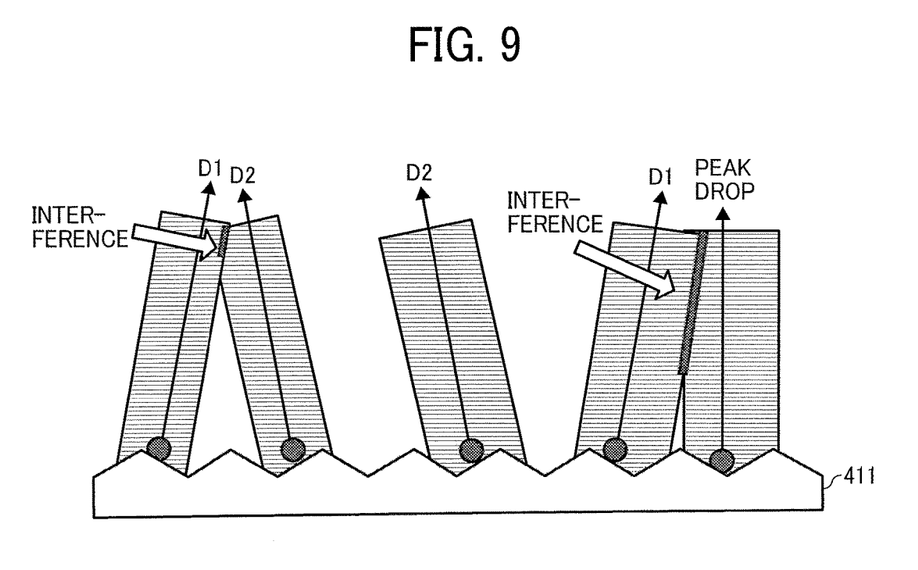
FIG. 9 is an illustrative diagram schematically illustrating a crystal structure in Example 1 and Example 2.

FIG. 9 is an illustrative diagram schematically illustrating a crystal structure in Example 1 and Example 2. As in Example 1 and Example 2, the growth directions D1 and D2 of crystal with a large grain size on the surface with a small surface roughness Sq are likely to be aligned in two directions. Accordingly, it is considered that the side surfaces of columnar crystal different in growth direction interfere with each other as illustrated in FIG. 9. The piezoelectric effect at the time of driving produced stress on the interfering portions. Accordingly, it is assumed that the stress advantageously acted on strain displacement of the PZT film 412 to result in the larger amounts of displacement than in Comparative Example 1.

Figure 10:
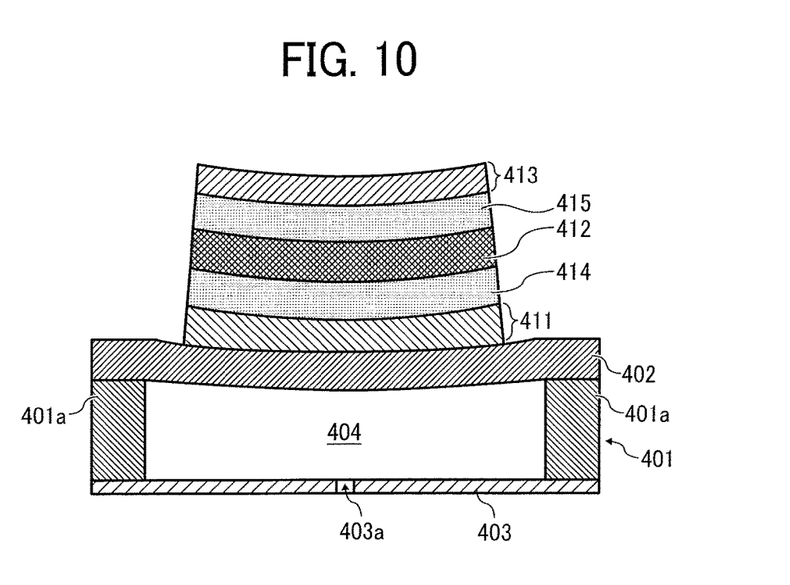
FIG. 10 is a cross-sectional view of a liquid discharge head according to an embodiment in which a diaphragm plate is curved and convex toward the inside of a pressurization chamber in a stationary condition with no application of a drive signal.

In addition, the liquid discharge head according to the present embodiment actually has the diaphragm plate 402 curved and convex toward the insides of the pressurization chambers 404 in the stationary state without application of a drive signal as illustrated in FIG. 10. Accordingly, the PZT film 412 of the electromechanical transducer element formed on the diaphragm plate 402 is also curved. It is considered that the large amounts of displacement were obtained in Example 1 and Example 2 in relation to the curved state as well as the crystal structure.

Next, the relationship between the shape of the rocking curve (the presence or absence of a drop) and the full width at half maximum is described. Electromechanical transducer elements different in full width at half maximum were produced with adjustments to the platinum film formation temperature (substrate temperature) at the time of production of the lower electrode 411. Table 2 below collectively shows the full widths at half maximum (FWHM) of the rocking curves and the shapes of the rocking curves.

TABLE 2

| FWHM [°] | Rocking curve shape |
| --- | --- |
| 7.7 | One peak without drop |
| 9.4 | One peak without drop |
| 9.6 | One peak without drop |
| 9.8 | One peak without drop |
| 10 | Two peaks with drop |
| 10.2 | Two peaks with drop |
| 11.2 | Two peaks with drop |
| 11.3 | Two peaks with drop |
| 12.4 | Two peaks with drop |
| 15 | Poor orientation |

When the platinum film formation temperature (substrate temperature) at the time of production of the lower electrode 411 was 300° C., the full width at half maximum of the rocking curve varied within a range of from 7.7° to 9.4°. However, all the rocking curves took sharp shapes with one peak and no drop. The amounts of displacement were 0.2 µm or less.

When the platinum film formation temperature (substrate temperature) at the time of production of the lower electrode 411 was 300° C. or more and less than 400° C., the full width at half maximum of the rocking curve varied within a range of from 9.6° to 9.8°. Most of the rocking curves took sharp shapes with one peak. However, the rocking curve shape varied within one wafer, and no stable reproducibility could be obtained.

When the platinum film formation temperature (substrate temperature) of at the time of production of the lower electrode 411 was 400° C. or higher, the full width at half maximum of the rocking curve varied within a range of 10° and more. When the full width at half maximum of the rocking curve was within a range of from 10° to 11.2°, most of the rocking curves took shapes with two peaks and a drop. Meanwhile, some of the rocking curves had a trapezoidal shape in which two peaks were linked almost linearly. The reproducibility was somewhat insufficient. However, when the full width at half maximum of the rocking curve was within a range of from 11.3° to 12.4°, all of the rocking curves take shapes with two peaks and a drop. High reproducibility was confirmed.

On the other hand, when the full width at half maximum of the rocking curve was 15°, the rocking curve took a broad shape, and the amount of displacement was small due to poor orientation.

The position (angle ω) of the drop A was near the center of the rocking curve in Example 1 and Example 2. However, it has been revealed that, even if the position was shifted to either one side, the same effect could be obtained. In addition, the positions (angles ω) of the two peaks B1 and B2 were approximately symmetric with respect to the center of the rocking curve (46.229°) in Example 1 and Example 2. However, it has been revealed that, even if the peaks were shifted to either one side, the same effect could be obtained. Further, the positions (angle ω) of the two peaks B1 and B2 were almost the same in peak intensity in Example 1 and Example 2. However, it has been revealed that, even if the positions had different peak intensities, the same effect could be obtained.

Figure 11:
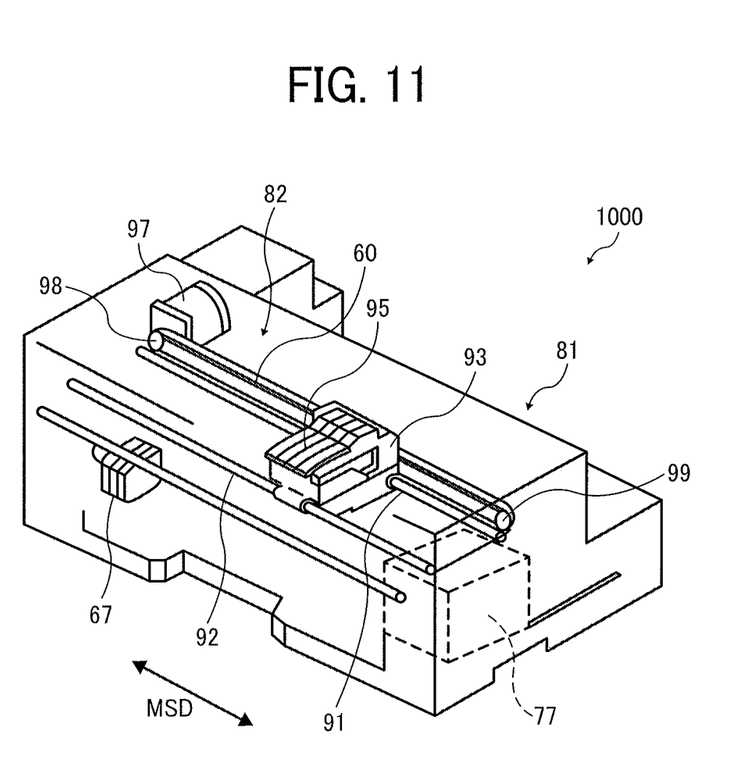
FIG. 11 is a perspective view of an example of an inkjet recording apparatus according to an embodiment.
Figure 12:
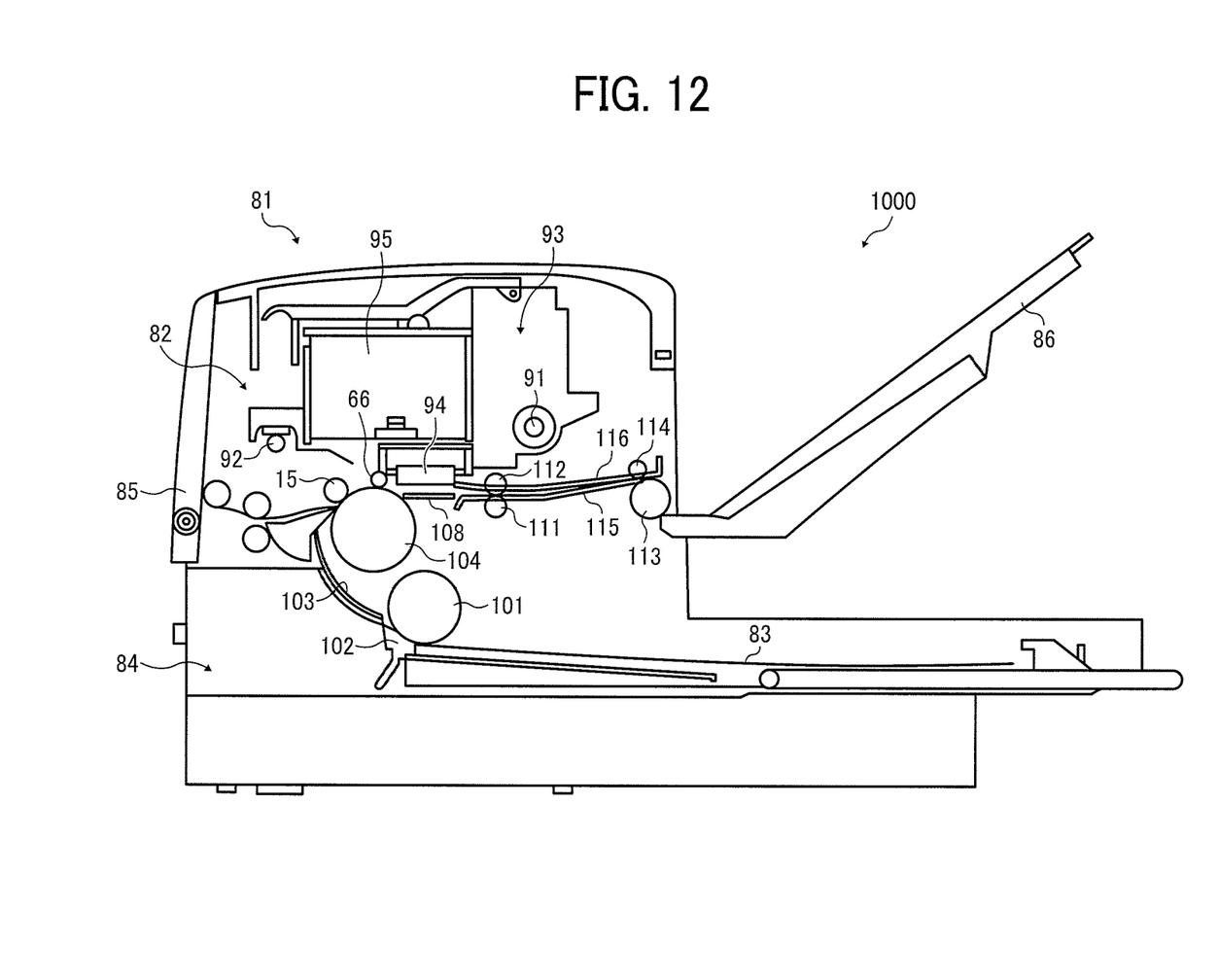
FIG. 12 is an illustrative side view of mechanical units of the inkjet recording apparatus.

Next, an inkjet recording apparatus is described as an example of the liquid discharge apparatus including the liquid discharge head according to the present embodiment. FIG. 11 is a perspective view of an example of the inkjet recording apparatus according to the present embodiment. FIG. 12 is a side view of a mechanical section of the inkjet recording apparatus of FIG. 11. An inkjet recording apparatus 1000 according to the present embodiment includes, e.g., a printing assembly 82 inside a recording apparatus body 81. The printing assembly 82 includes, e.g., a carriage 93 movable in a main-scanning direction indicated by arrow MSD in FIG. 11, ink cartridges 95 serving as liquid cartridges to supply ink, which is liquid for image formation, to a plurality of liquid discharge heads 94 mounted in the carriage 93. A sheet feeding cassette (or a sheet tray) 84 to stack a large number of sheets 83 as recording media is attached to a lower portion of the recording apparatus body 81 in such a manner that the sheet feeding cassette 84 can be inserted into and removed from the front side of the recording apparatus body 81. In addition, a bypass tray 85 for manually feeding sheets 83 is disposed to be tiltable to open. When a sheet 83 fed from the sheet feeding cassette 84 or the bypass tray 85 is taken in, the printing assembly 82 records a desired image on the sheet 83. Then, the sheet 83 is ejected to a sheet ejection tray 86 mounted on a back face side of the recording apparatus body 81.

In the printing assembly 82, a main guide rod 91 and a sub-guide rod 92 as guides laterally bridged between left and right side plates support the carriage 93 slidably in the main scanning direction MSD. In the carriage 93, nozzles as a plurality of ink discharge ports are arrayed in a direction crossing the main-scanning direction MSD, and the plurality of liquid discharge heads 94 is mounted so as to have a droplet discharge direction toward the lower side. The liquid discharge heads 94 are heads (inkjet heads) to discharge droplets of, e.g., colors of yellow (Y), cyan (C), magenta (M), and black (Bk). In addition, the ink cartridges 95 to supply ink of the respective colors to the liquid discharge heads 94 are replaceably mounted on the carriage 93.

Each of the ink cartridges 95 includes an air communication port communicated with the atmosphere in an upper portion of each ink cartridge 95, an ink supply port in a lower portion of each ink cartridge 95, and a porous body to be filled with ink inside each ink cartridge 95. In each ink cartridge 95, liquid (ink) to be supplied to each liquid discharge head 94 is maintained in slightly negative pressure by capillary force of the porous body. In the present embodiment, the four liquid discharge heads 94 are used corresponding to the respective colors. However, in some embodiments, for example, a single liquid discharge head having a plurality of nozzles that discharge droplets of different colors may be used.

Note that a rear side (a downstream side in a sheet conveyance direction) of the carriage 93 is slidably fitted to the main guide rod 91, and a front side (an upstream side in a sheet conveyance direction) of the carriage 93 is slidably mounted to the sub-guide rod 92. To move the carriage 93 for scanning in the main-scanning direction MSD, a timing belt 100 is stretched taut between a driving pulley 98 rotated by a main scanning motor 97 and a driven pulley 99. The timing belt 100 is secured to the carriage 93, and the carriage 93 is driven to reciprocate according to forward and reverse rotation of the main scanning motor 97.

To convey the sheets 83 set on the sheet feeding cassette 84 to below the liquid discharge heads 94, the inkjet recording apparatus 1000 includes a sheet feeding roller 101, a friction pad 102, a sheet guide 103, a conveyance roller 104, and a leading end roller 106. The sheet feeding roller 101 and the friction pad 102 separate and feed a sheet 83 from the sheet feeding cassette 84, and the sheet guide 103 guides the sheet 83. The conveyance roller 104 turns over and conveys the fed sheet 83. The leading end roller 106 defines the feed angle of the sheet 83 from the conveyance roller 104 and the conveyance roller 105 pressed to the peripheral face of the conveyance roller 104. The conveyance roller 104 is driven to rotate by a sub-scanning motor 107 via a gear train.

A print receiver 109 as a sheet guide is provided to guide the sheet 83 fed from the conveyance roller 104 below the liquid discharge heads 94 in accordance with the movement range of the carriage 93 in the main-scanning direction MSD. On the downstream side of the print receiver 109 in the sheet conveyance direction are disposed a conveyance roller 111 and a spur roller 112 that are driven to rotate so as to feed the sheet 83 in a sheet ejecting direction. The inkjet recording apparatus 1000 further includes a sheet ejection roller 113 and a spur roller 114 to feed the sheet 83 to the sheet ejection tray 86 and guides 115 and 116 constituting a sheet ejection passage.

In recording, the inkjet recording apparatus 1000 drives the liquid discharge heads 94 in response to image signals while moving the carriage 93, discharges ink to the stopped sheet 83 to record one line of a desired image on the sheet 83, feeds the sheet 83 in a predetermined amount, and then records a next line on the sheet 83. When the inkjet recording apparatus 1000 receives a signal indicating that a rear end of the sheet 83 has reached a recording area, the inkjet recording apparatus 1000 terminates a recording operation and ejects the sheet 83.

The inkjet recording apparatus 1000 further includes a recovery device 117 to recover a discharge failure of the liquid discharge heads 94, which is disposed at a position outside a recording area at the right end side in a movement direction of the carriage 93. The recovery device 117 includes a cap unit, a suction unit, and a cleaning unit. The carriage 93 moves to the side of the recovery device 117 in a printing standby mode, the liquid discharge heads 94 are capped by the capping device. Thus, the nozzles as discharge ports are maintained in a wet state, thus preventing occurrence of discharge failure due to ink dry. For example, during recording, the inkjet recording apparatus 1000 discharges ink not relating to the recording to maintain the viscosity of ink in all of the discharge ports constant, thus maintaining stable discharging performance.

When a discharge failure occurs, the discharge ports (nozzles) of the liquid discharge heads 94 are sealed by the capping device and ink and bubbles are sucked from the discharge ports by the suction device through a tube. The cleaning device removes ink and dusts adhered to a discharge port face, thus recovering the discharge failure. The sucked ink is drained to a waste ink container disposed on a lower portion of the apparatus body, and is absorbed into and retained in an ink absorber of the waste ink container.

As described above, the liquid discharge heads 94 according to any of the above-described embodiment and Examples 1 through 6 are mountable in the inkjet recording apparatus. Such a configuration obtains stable ink droplet discharge properties without discharge failure due to drive failure of the diaphragm, thus enhancing image quality.

In the present disclosure, the liquid discharge apparatus includes the liquid discharge head or the liquid discharge device, and drives the liquid discharge head to discharge liquid. The liquid discharge apparatus may be, for example, an apparatus capable of discharging liquid to a material to which liquid can adhere and an apparatus to discharge liquid toward gas or into liquid.

The liquid discharge apparatus may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged. The liquid discharge apparatus may be, for example, an image forming apparatus to form an image on a sheet by discharging ink, or a three-dimensional apparatus to discharge a molding liquid to a powder layer in which powder material is formed in layers, so as to form a three-dimensional article. In addition, the liquid discharge apparatus is not limited to such an apparatus to form and visualize meaningful images, such as letters or figures, with discharged liquid. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited. Examples of the material on which liquid can be adhered include any materials on which liquid can be adhered even temporarily, such as paper, thread, fiber, fabric, leather, metal, plastic, glass, wood, and ceramic.

Examples of the liquid are, e.g., ink, treatment liquid, DNA sample, resist, pattern material, binder, mold liquid, or solution and dispersion liquid including amino acid, protein, or calcium.

The liquid discharge apparatus may be an apparatus to relatively move a liquid discharge head and a material on which liquid can be adhered. However, the liquid discharge apparatus is not limited to such an apparatus. For example, the liquid discharge apparatus may be a serial head apparatus that moves the liquid discharge head or a line head apparatus that does not move the liquid discharge head. Examples of the liquid discharge apparatus further include a treatment liquid coating apparatus to discharge a treatment liquid to a sheet to coat the treatment liquid on the surface of the sheet to reform the sheet surface and an injection granulation apparatus in which a composition liquid including raw materials dispersed in a solution is injected through nozzles to granulate fine particles of the raw materials.

The liquid discharge device is an integrated unit of the liquid discharge head and an external component(s), such as a functional part(s) or mechanism(s), and is an assembly of parts relating to liquid discharge. For example, the liquid discharge device may be a combination of the liquid discharge head (e.g., the liquid discharge head 94) with at least one of a head tank (e.g., the ink cartridges 95), a carriage (e.g., the carriage 93), a supply unit, a maintenance unit (e.g., the recovery device 117), and a main scan moving unit (e.g., the timing belt 100, the driving pulley 98, the main scanning motor 97, and the driven pulley 99). Here, examples of the integrated unit include a combination in which the liquid discharge head and a functional part(s) are secured to each other through, e.g., fastening, bonding, or engaging, and a combination in which one of the liquid discharge head and a functional part(s) is movably held by another. The liquid discharge head may be detachably attached to the functional part(s) or unit(s) s each other.

For example, the liquid discharge head and a head tank are integrated as the liquid discharge device. The liquid discharge head and the head tank may be connected each other via, e.g., a tube to integrally form the liquid discharge device. Here, a unit including a filter may further be added to a portion between the head tank and the liquid discharge head. In another example, the liquid discharge device may be an integrated unit in which a liquid discharge head is integrated with a carriage. In still another example, the liquid discharge device may be the liquid discharge head movably held by a guide that forms part of a main-scanning moving device, so that the liquid discharge head and the main-scanning moving device are integrated as a single unit. The liquid discharge device may be an integrated unit in which the liquid discharge head, the carriage, and the main scan moving unit are integrally formed as a single unit. The main-scan moving unit may be a guide only. In another example, the cap that forms part of the maintenance unit is secured to the carriage mounting the liquid discharge head so that the liquid discharge head, the carriage, and the maintenance unit are integrated as a single unit to form the liquid discharge device. Further, in another example, the liquid discharge device includes tubes connected to the head tank or the channel member mounted on the liquid discharge head so that the liquid discharge head and the supply assembly are integrated as a single unit. The supply unit may be a tube(s) only or a loading unit only.

The above-described embodiments are limited examples, and the present disclosure includes, for example, the following aspects having advantageous effects.

Aspect A

An electromechanical transducer element includes at least a first electrode, such as the lower electrode 411, a piezoelectric material, such as the PZT film 412, and a second electrode such as the upper electrode 413 that are laminated in sequence. The electromechanical transducer element deforms the piezoelectric material with a voltage applied according to a drive signal. The piezoelectric material is made of a composite oxide having a perovskite structure preferentially oriented in at least one of a (100) plane and a (001) plane. A drop, such as the drop A in FIG. 3, in diffraction intensity is included in a rocking curve corresponding to at least one of a (200) plane and a (002) plane measured at a position (2θ) where the diffraction intensity is largest at a peak of diffraction intensity corresponding to the (200) plane out of peaks of diffraction intensity measured by an X-ray diffraction θ-2θ method. It has been conventionally considered favorable that, in a piezoelectric material made of a composite oxide having a perovskite structure preferentially oriented in at least one of the (100) plane and the (001) plane, the growth directions of crystal are aligned to increase the amount of displacement by which a displacement plate supporting a first electrode is displaced by piezoelectric effect. As the growth directions of crystal are more aligned, the shape of the rocking curve becomes sharper with a narrow full width at half maximum centered on one peak corresponding to the growth direction. Therefore, piezoelectric materials have been conventionally produced with a narrower full width at half maximum of a rocking curve having one peak. However, the amount of displacement obtained according to the conventional concept is limited, and an electromechanical transducer element offering a larger amount of displacement has been desired. The inventors have earnestly conducted studies and revealed that a piezoelectric material with a drop A in diffraction intensity in a rocking curve corresponding to at least one of a (200) plane and a (002) plane measured at a position (2θ) where the diffraction intensity is largest at a peak of diffraction intensity corresponding to the (200) plane out of peaks of diffraction intensity measured by an X-ray diffraction θ-2θ method would be capable of producing a larger amount of displacement than conventional piezoelectric materials with one peak in a rocking curve. More particularly, the presence of the drop A in the rocking curve means that there are at least two peaks B1 and B2 with the drop between the two peaks. That is, it is considered that the growth directions of crystal in the piezoelectric material are not aligned in one direction but are aligned in two separate directions corresponding to the two peaks. When the crystal in the piezoelectric material is divided into two or more kinds of crystal portions different in growth direction as described above, there arises interference between the crystal portions different in growth direction of crystal, along directions orthogonal to the growth directions of crystal. Since the piezoelectric effect of the piezoelectric material produces stress on the interfering portions, it is considered that the stress advantageously acts on the deformation of the piezoelectric material, thereby leading to increase in the amount of displacement of the displacement plate. In the conventional piezoelectric materials, the growth directions of crystal are aligned in one direction and thus such interfering portions are few in number, and the displacement plate is displaced without using the stress produced on the interfering portions.

Therefore, according to the present aspect, it is possible to achieve a large amount of displacement that could not have been achieved by the conventional piezoelectric materials.

Aspect B

In Aspect A, the piezoelectric material has only two peaks, such as the two peaks B1 and B2 in FIG. 3, with the drop between the two peaks as peaks existing in the rocking curve. When the growth directions of crystal in the piezoelectric material vary largely, it is not possible to obtain a large amount of displacement due to the poor orientation. With only the two peaks existing in the rocking curve, it is possible to achieve a large amount of displacement using the stress produced on the interfering portions while maintaining high orientation.

Aspect C

In Aspect A or B, the full width at half maximum of the rocking curve falls within a range of from 10 to 12.4 degrees. Such a configuration can achieve a large amount of displacement using the stress produced on the interfering portions while maintaining high orientation.

Aspect D

In any one of Aspects A to C, the first electrode includes at least platinum, and root-mean-square height Sq of surface roughness of a plane of the first electrode on which the piezoelectric material is formed is 3 or less. Such a configuration can achieve a piezoelectric material with the drop A in the rocking curve.

Aspect E

In any one of Aspects A to D, a seed layer made of titanium oxide or lead titanate is included between the piezoelectric material and the first electrode. Such a configuration can achieve a piezoelectric material providing a large amount of displacement.

Aspect F

A liquid discharge head including a discharge orifice, such as the nozzle 403a, to discharge liquid, a liquid chamber, such as the pressurization chamber 404, communicated with the discharge orifice, a displacement plate, such as the diaphragm plate 402, constituting at least one wall of the liquid chamber, and the electromechanical transducer element according to any one of Aspects A to E to displace the displacement plate in accordance with a drive signal. Such a configuration can achieve a liquid discharge head that is capable of displacing largely a displacement plate and performing a more stable discharging action.

Aspect G

A liquid discharge device includes the liquid discharge head, such as the liquid discharge head 94, according to Aspect F to discharge liquid from the discharge orifice according to the drive signal and at least one external component, such as the carriage 93, the ink cartridge 95, the recovery device 117, and the main scanning motor 97, integrated with the liquid discharge head. Such a configuration can achieve a liquid discharge device that has a liquid discharge head capable of displacing largely a displacement plate and performing a stable discharging action.

Aspect H

A liquid discharge apparatus, such as the inkjet recording apparatus 1000, includes the liquid discharge head according to Aspect F to discharge liquid from the discharge orifice in accordance with the drive signal. Such a configuration can achieve a liquid discharge apparatus that has a liquid discharge head capable of displacing largely a displacement plate and performing a stable discharging action.

Aspect I

In a method of producing an electromechanical transducer element that includes at least a first electrode, such as the lower electrode 411, a second electrode, such as the upper electrode 413, and a piezoelectric material, such as the PZT film 412, disposed between the first electrode and the second electrode and deformable with a voltage applied between the first electrode and the second electrode in accordance with a drive signal. The piezoelectric material is made of a composite oxide having a perovskite structure preferentially oriented in at least one of a (100) plane and a (001) plane and includes a drop in diffraction intensity in a rocking curve corresponding to at least one of a (200) plane and a (002) plane measured at a position ($2\theta$) where the diffraction intensity is largest at a peak of diffraction intensity corresponding to the (200) plane out of peaks of diffraction intensity measured by an X-ray diffraction $\theta$-$2\theta$ method. In the method, the piezoelectric material is directly or indirectly formed on the first electrode. Such a configuration can produce an electromechanical transducer element that achieves a large amount of displacement that could not be achieved by conventional piezoelectric materials.

Aspect J

In Aspect I, the first electrode is directly or indirectly formed on the substrate under a condition in which the temperature of the substrate is 400° C. or higher. Such a configuration can achieve a piezoelectric material with the drop A in the rocking curve.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electromechanical transducer element, comprising:
    a first electrode;
    a second electrode; and
    a piezoelectric material that is disposed between the first electrode and the second electrode and is deformable with a voltage applied in accordance with a drive signal,
    wherein the piezoelectric material is made of a composite oxide having a perovskite structure preferentially oriented in at least one of a (100) plane and a (001) plane, and
    wherein for the piezoelectric material, a drop in diffraction intensity is included in a rocking curve corresponding to at least one of a (200) plane and a (002) plane measured at a position of $2\theta$ where the diffraction intensity is largest at a peak of diffraction intensity corresponding to the (200) plane out of peaks of diffraction intensity measured by an X-ray diffraction $\theta$-$2\theta$ method, and
    wherein the first electrode is formed of a material including platinum, and a root-mean-square height Sq of surface roughness of a plane of the first electrode on which the piezoelectric material is formed is three or less.

2. The electromechanical transducer element according to claim 1, wherein the piezoelectric material has only two peaks in the rocking curve with the drop interposed between the two peaks.

3. The electromechanical transducer element according to claim 1,
    wherein a full width at half maximum of the rocking curve falls within a range of from 10 to 12.4 degrees.

4. The electromechanical transducer element according to claim 1,
   further comprising a seed layer made of titanium oxide or lead titanate between the piezoelectric material and the first electrode.

5. A liquid discharge head, comprising:
   a discharge orifice to discharge liquid;
   a liquid chamber communicated with the discharge orifice;
   a displacement plate constituting at least one wall of the liquid chamber; and
   the electromechanical transducer element according to claim 1 to displace the displacement plate in accordance with the drive signal.

6. A liquid discharge device comprising:
   the liquid discharge head according to claim 5 to discharge liquid from the discharge orifice in accordance with the drive signal; and
   at least one external component integrated with the liquid discharge head as a single unit.

7. A liquid discharge apparatus comprising the liquid discharge head according to claim 5 to discharge the liquid from the discharge orifice in accordance with the drive signal.

8. A method of producing the electromechanical transducer element according to claim 1, the method comprising directly or indirectly forming the piezoelectric material on the first electrode of the electromechanical transducer element.

9. The method according to claim 8, wherein the forming includes forming the first electrode directly or indirectly on a substrate under a condition in which a temperature of the substrate is 400° C. or higher.

10. The electromechanical transducer element according to claim 1,
    wherein the piezoelectric material includes two columnar crystals having different growth directions, and
    wherein side surfaces of the respective columnar crystals partially interfere with each other.

* * * * *